(12) United States Patent
Grosse et al.

(10) Patent No.: US 6,396,214 B1
(45) Date of Patent: May 28, 2002

(54) DEVICE FOR PRODUCING A FREE COLD PLASMA JET

(75) Inventors: Stefan Grosse, Gerlingen; Thomas Weber, Korntal-Münchingen; Astrid Gahl, Stuttgart, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/601,732

(22) PCT Filed: Nov. 12, 1999

(86) PCT No.: PCT/DE99/03612

§ 371 (c)(1),
(2), (4) Date: Nov. 20, 2000

(87) PCT Pub. No.: WO00/35256

PCT Pub. Date: Jun. 15, 2000

(30) Foreign Application Priority Data

Dec. 7, 1998 (DE) .......................... 198 56 307

(51) Int. Cl.[7] .................................. H01J 7/24
(52) U.S. Cl. ........................ 315/111.41; 315/111.21; 315/111.71
(58) Field of Search ................. 315/111.41, 111.21, 315/111.71, 111.81, 111.91

(56) References Cited

U.S. PATENT DOCUMENTS

| 4,970,435 | A | * | 11/1990 | Tanaka et al. | ........... 315/111.21 |
| 5,002,632 | A | | 3/1991 | Loewenstein et al. | ...... 156/643 |
| 5,111,111 | A | * | 5/1992 | Stevens et al. | ......... 315/111.41 |

FOREIGN PATENT DOCUMENTS

| EP | 0 296 921 | 12/1988 |
| JP | 06 336 662 | 12/1994 |

OTHER PUBLICATIONS

A. Ricard, *Introduction Aux Plasmas Froids*, REE, Nr. 4, 1., Apr. 1, 1998, pp. 82–84. Copy of reference is not enclosed because reference is cited in Search Report (copy of reference provided by International Searching Authority).

Vulkanovic et al. Plasma Etching of Organic Materials . . . , Journal of Vacuum Science & Technology, Section B, Woodbury, NY. Bd. 6, Nr. 1, Jan. 1988. Copy of reference is not enclosed because reference is cited in Search Report (copy of reference provided by International Searching Authority).

Seite 67, Absatz 1—letzter Absatz, Abbildungen 1,2. Copy of reference is not enclosed because reference is cited in Search Report (copy of reference provided by International Searching Authority).

Mosian et al., Plasma Sources Based on the Propagation of Electromagnetic Surface Waves, J. Phys. D: Appl. Phys. 24 (1991), pp. 1025–1048. Described in specification.

Margot et al., Physics of Surface Wave Discharges, Proceedings of Plasma Processing of Semiconductors, Chateau de Bonas, France (1997), pp. 187–210. Described in specification.

\* cited by examiner

Primary Examiner—Don Wong
Assistant Examiner—Tuyet T. Vo
(74) Attorney, Agent, or Firm—Kenyon & Kenyon

(57) ABSTRACT

A device for generating a free cold plasma beam having a high-frequency plasma source and a hollow body transparent to electromagnetic radiation, which is provided with at least one gas inlet opening and at least one beam outlet opening is proposed. The high-frequency plasma source is in particular a microwave plasma source or a high-frequency plasma source and initially generates at least within the hollow body a cold gas plasma, which is conducted as a free cold plasma beam via the beam outlet opening from the hollow body and enters the work chamber. The work chamber is under vacuum. The free plasma beam remains bundled in the work chamber and can be used there for cleaning, etching, or plasma coating with a reactive gas.

17 Claims, 2 Drawing Sheets

DEVICE FOR PRODUCING A FREE COLD PLASMA JET

BACKGROUND INFORMATION

The present invention relates to a device for generating a free cold plasma beam.

In surface treatment of workpieces the use of plasma technology is well known. There are thermal plasmas generated at atmospheric pressure or in a near-atmospheric pressure range and at temperatures that may reach thousands of degrees. There are also cold plasmas used in vacuum. They provide high activation energies for chemical reactions, typically do not heat the gas over 500° C. and thus allow surface treatements and layer depositions on temperature-sensitive workpieces. In addition, many layers having technically relevant properties can only be synthesized using cold plasmas. In particular, plasmas produced by microwave radiation offer high deposition rates for vacuum coating processes, as well as a good layer quality. Typical plasma densities for this method are approximately $10^{11}$ ions/cm$^3$.

However, in using these technologies, it is often difficult to spatially separate plasma generation from its application for surface treatment or layer deposition; otherwise the equipment for generating the plasma within the equipment is undesirably also affected, for example, by deposition processes, which results in high maintenance and downtime costs.

Therefore it is known from the related art that a free, however hot, i.e. thermal, plasma beam can be emitted from a plasma source and thus plasma production and industrial use of this plasma beam, for example, in a downstream coating apparatus, can be spatially separated. A free plasma beam is defined as a plasma beam that propagates in a larger volume without being guided by equipment or auxiliary devices. Such beams include different versions of plasma sprays such as described in the publication "VI. Workshop für Plasmatechnik (1998), TU Ilmenau. FG Plasma- und Oberflächentechnik." These free, but hot, or thermal, plasma beams do not widen substantially as they enter in the coating apparatus which is under atmospheric or near-atmospheric pressure and can thus be accurately guided to the point of use.

Many industrially relevant surface treatment and coating processes can only be carried out in vacuum with cold plasmas for reasons of process technology. However, in vacuum, obtaining a free bundled beam that is not disturbed by diffusion or convection is problematic.

Also known from the related art is the propagation of plasmas within a tube that is transparent to electromagnetic radiation due to electromagnetic surface waves whose frequency is in the microwave range or in near-microwave frequency bands. These surface waves propagate along the boundary surface between the electrically conductive plasma and the tube. Plasma sources based on this principle are referred to as "wave launchers" (M. Moisan and Z. Zakrewski, Plasma sources based on the propagation of electromagnetic surface waves, J. Phys. D: Appl. Phys. 24 (1991) 1025–1048) and work both in vacuum and under atmospheric pressure. At atmospheric pressure this plasma may propagate outside the tube for a few centimeters as a thermal plasma in the form of a free, bundled beam. To date, this has not been considered possible for cold plasmas and, in particular, for cold microwave plasmas or high-frequency plasmas in vacuum (J. Margot and M. Moisan, Physics of surface wave discharges, Proceedings of Plasma Processing of Semiconductors, Chateau de Bonas, France (1997), 187–210).

A plasma is typically densest at the point of injection, i.e., directly on or in the plasma source. Therefore, in the related art, distinction is made between direct processes and remote processes. In direct processes deposition takes place by adding reactive gas directly at the point of injection, i.e. at the point of highest plasma density, so that in this case the excitation states can be used most effectively for layer deposition. One disadvantage of the direct processes is, however, that the injection structures are necessarily involved, due to undesirable deposition processes, in the coating operation. In order to avoid this disadvantage, remote processes are often used. In such processes the reactive gas is only added to a plasma at some distance from the injection structure in order to reduce contamination. However this also reduces plasma density and therefore effectiveness.

Production of a free, cold, high-frequency plasma beam and a suitable apparatus, where initially a cold plasma is produced in a hollow body transparent to electromagnetic radiation, this plasma then being guided into a work chamber under vacuum, separate from the plasma source and from the production of this beam, where it propagates over a longer distance of up to 1 m, is not yet known.

SUMMARY OF THE INVENTION

The device according to the present invention having the characterizing features of claim 1 has the advantage over the related art that the cold gas plasma in the form of a bundled high-frequency plasma beam is conducted into a work chamber under vacuum that is separate from the plasma source and from the production of this beam, and there propagates as a free, cold plasma beam having an almost constant diameter, i.e., with only a slight diffusion widening. This allows processes that were previously impossible, in particular in industry, such as, for example, specific treatments of workpieces, to be carried out. The free, cold plasma beam is stable, due to the design of the work chamber and plasma producing zone and their connection without any additionally generated electromagnetic fields, over a larger distance in the work chamber and remains bundled. This also allows geometrically complex workpieces to be processed.

Furthermore, the device according to the present invention offers the possibility of combining the advantages of direct coating processes and remote processes. The production of a free plasma beam makes direct coating in an intensive plasma beam possible by adding a reactive gas while the coating process is farther removed from the point of plasma production. This considerably simplifies maintenance and reduces system downtime, while increasing the effectiveness of the coating process.

The cold plasma beam according to the present invention also has a very high plasma density of more than $10^{12}$ ions/cm$^3$, which results in high effectiveness. Thus high growth rates are achieved in coating processes and high removal rates in etching processes.

Because the cold plasma beam only slightly heats the gas while making a high activation energy available for chemical reactions, temperature-sensitive workpieces can also be treated.

Thus, it is very advantageous that the free, cold, high-frequency plasma beam can be used in a work chamber under vacuum, in particular a vacuum from 0.1 Pa to 1000 Pa. On the one hand, the device according to the present invention can be operated in a chamber that is not under high vacuum; on the other hand, vacuum is used to effectively carry out many technically relevant plasma processes. Examples include etching processes, layer adhesion enhancing processes, and deposition of extremely compact layers having a low degree of surface roughness.

The diameter and length of the free plasma beam and thus variations in space in the deposition, growth, and etching rates can be controlled in a simple manner via process parameters such as, for example, gas pressure, gas flow rate, microwave power or high frequency power, as well as the high frequency or microwave frequency used to generate the gas plasma. The gas plasma is advantageously generated within the hollow body that is transparent to electromagnetic radiation via an essentially known commercially available microwave plasma source having slot antenna injection. As an alternative, a high-frequency plasma source, which is also commercially available, can also be used.

In addition, it is highly advantageous that the direction of propagation of the free plasma beam in the work chamber is not, or is only slightly, influenced by the direction of the gas flow within the work chamber, since the electromagnetic field distribution has primary importance in determining the direction of propagation. Therefore, the gas may flow in the work chamber perpendicularly to the direction of propagation of the free plasma beam, for example, without the plasma beam becoming noticeably curved. This property allows two intersecting plasma beams, directed against one another, for example, along a single line, to be generated in the work chamber. The resulting combined beam is then characterized by increased axial homogeneity. This arrangement is particularly well-suited for coating large-surface workpieces.

Furthermore, the injection geometry, i.e., the shape of the hollow body transparent to electromagnetic radiation in which the plasma is initially generated and the beam outlet opening can be adjusted to specific requirements of the beam geometry in the work chamber. Thus, the flat design of the hollow body, for example, as a parallelepiped having a beam outlet opening in the form of a slot, results in the generated free plasma beam entering the work chamber as a flat plasma beam. The free plasma beam thus generated is advantageously well-suited for coating, cleaning, or etching of large-surface workpieces.

The free plasma beam can be used in combination with other processes, including processes that do not involve a plasma beam source, in a simple manner.

DETAILED DESCRIPTION

Figure 1:
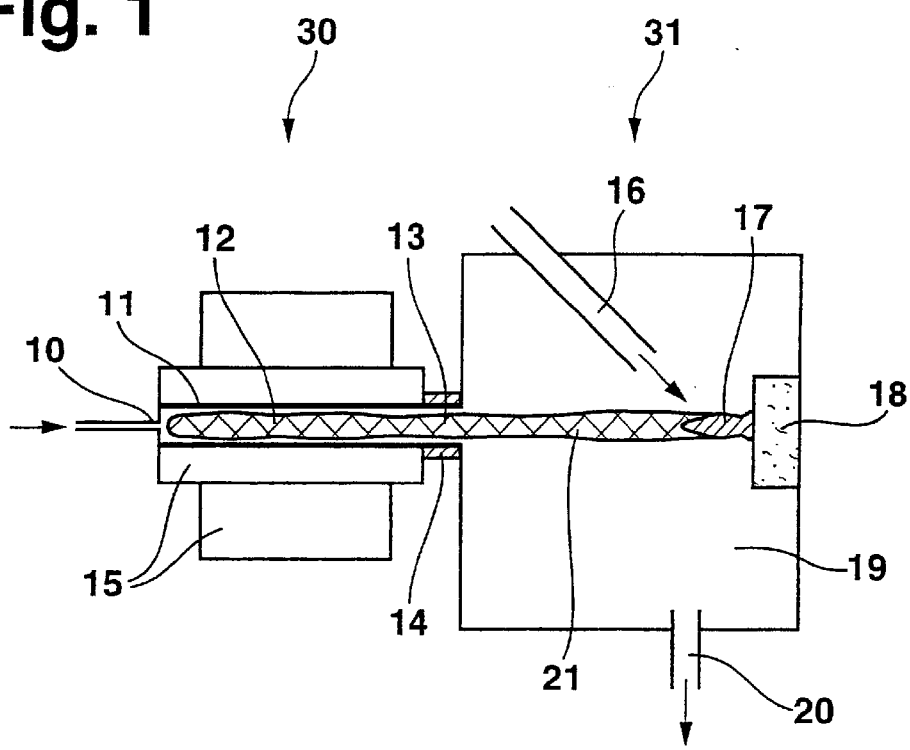
FIG. 1 shows a section diagram of the device for generating a free plasma beam.

FIG. 1 shows a first embodiment of the device for generating a free cold plasma beam. For this purpose a gas is introduced in a hollow body 11 that is transparent to electromagnetic radiation via a gas inlet opening 10. This gas may be an inert gas, in particular, argon, or oxygen, nitrogen, or hydrogen introduced in the hollow body at the flow rate of 100 sccm to 10,000 sccm, preferably from 1000 sccm to 10,000 sccm in hollow body 11 at a pressure of 0.1 Pa to 1000 Pa, preferably of 50 Pa. Hollow body 11 surrounds a commercially available, essentially known high-frequency plasma source 15, which is designed, for example, as a microwave plasma source having slot antenna injection and working at the frequency of 2.45 GHz. High-frequency plasma source 15 injects an electromagnetic power of 20 W to 10 kW, preferably of 500 W, into hollow body 11 containing the gas and thus generates a cold gas plasma 12 within hollow body 11.

High-frequency plasma source 15 can also be designed in the form of an essentially known commercially available high-frequency plasma source instead of a microwave plasma source. Microwaves are understood to be waves having a frequency of more than 300 MHz, while a high-frequency plasma source operates with frequencies as low as 10 MHz to 300 MHz.

Gas plasma 12 propagates in hollow body 11, which is designed as a quartz glass tube having a length of 300 mm and a diameter of 25 mm, and is initially contained by its walls. Hollow body 11 can also be made of a different material transparent to electromagnetic radiation, for example, it can be designed as a gas tube or a ceramic tube.

Electromagnetic surface waves can propagate on the boundary between gas plasma 12, acting as an electrical conductor, and the surrounding tube acting as hollow body 11.

Gas plasma 12 is then introduced from hollow body 11 into work chamber 19 as a free cold plasma beam 21 within the given power, pressure, and gas flow rate ranges. Electromagnetic surface waves propagate on free, cold plasma beam 21, bundling it simultaneously.

Work chamber 19 is made of metal, in particular, and has a typical edge length of 0.40 m, so that the formation and propagation of free plasma beam 21 is not negatively affected. Free cold plasma beam 21 does not widen substantially due to diffusion or convection in vacuum over a distance of typically 0.5 m as it enters work chamber 19, except for a slight widening immediately upon entering work chamber 19, but remains bundled. As in hollow body 11 in work chamber 19, there is a vacuum of 1 Pa to 1000 Pa, preferably of approximately 50 Pa in work chamber 19; this vacuum is maintained by pumps connected to evacuation tube 20.

The diameter and length of the free cold plasma beam 21 can be influenced by adjusting the gas flow rate, the gas pressure, and the microwave or high-frequency power injected. Free plasma beam 21 impinges on a workpiece 18 within work chamber 19, a reactive gas, for example, acetylene, methane, silane, or hexamethyldisiloxane (HMDS(O)), tetramethylsilane (TMS) or tetraethoxysilane (TEOS) being supplied to plasma beam 13 via a gas supply pipe 16 before it impinges on the workpiece, so that a reaction zone 17 is formed upstream from workpiece 18, and workpiece 18 is surface coated. Furthermore, a plurality of reactive gases can also be introduced in free plasma beam 21, or free plasma beam 21 can also be used alone, without a reactive gas, for example, for cleaning workpiece 18. Plasma densities of over $10^{12}$ ions/cm$^3$ can be achieved within free plasma beam 21.

The bundling of free plasma beam 21 can be explained with the help of surface waves which propagate from hollow body 11, within which cold gas plasma 12 is generated, into the work chamber. The intensity of the electrical field of the surface waves is maximum on the boundary surface between plasma 21, 12, and hollow body 11 and, in particular, also the vacuum. Therefore, ponderomotive forces (F. Chen, Introduction to Plasma Physics and Controlled Fusion, Vol.

1, Plenum Press, New York (1984)) act upon electrons and ions of free cold plasma beam 21 in the direction of decreasing field intensity, i.e. in particular, in the direction of the center of the beam as well, so that there is a counter-current to the diffusion current or convection current, which causes the beam to widen. Therefore surface waves can bundle free plasma beam 21 and also use it as a propagation medium.

Therefore, the device is divided into two separate areas: a plasma generation zone 30 and a work zone 31. The two areas are connected via a transition element 14 designed, for example, as a metal ring, which surrounds hollow body 11 in some areas or is located between hollow body 11 and work chamber 19.

The dimensions of both high-frequency plasma source 15, in particular the dimensions of hollow body 11, and of free plasma beam 21 and gas plasma 12 can be scaled using parameters such as the frequency of the electromagnetic radiation, power, pressure, gas flow rate, and gas type. Thus, hollow body 11 in the form of a tube can have a length of 1 cm to 2 m and an inner diameter of 1 mm to 200 mm.

High-frequency plasma source 15 can be operated both in continuous wave mode and pulse mode. The pulse mode offers the advantage of more homogeneous deposition and etching rates, which is particularly advantageous in coating three-dimensional workpieces. In addition, the gases are activated with high power, while the heat load remains low.

Figure 2:
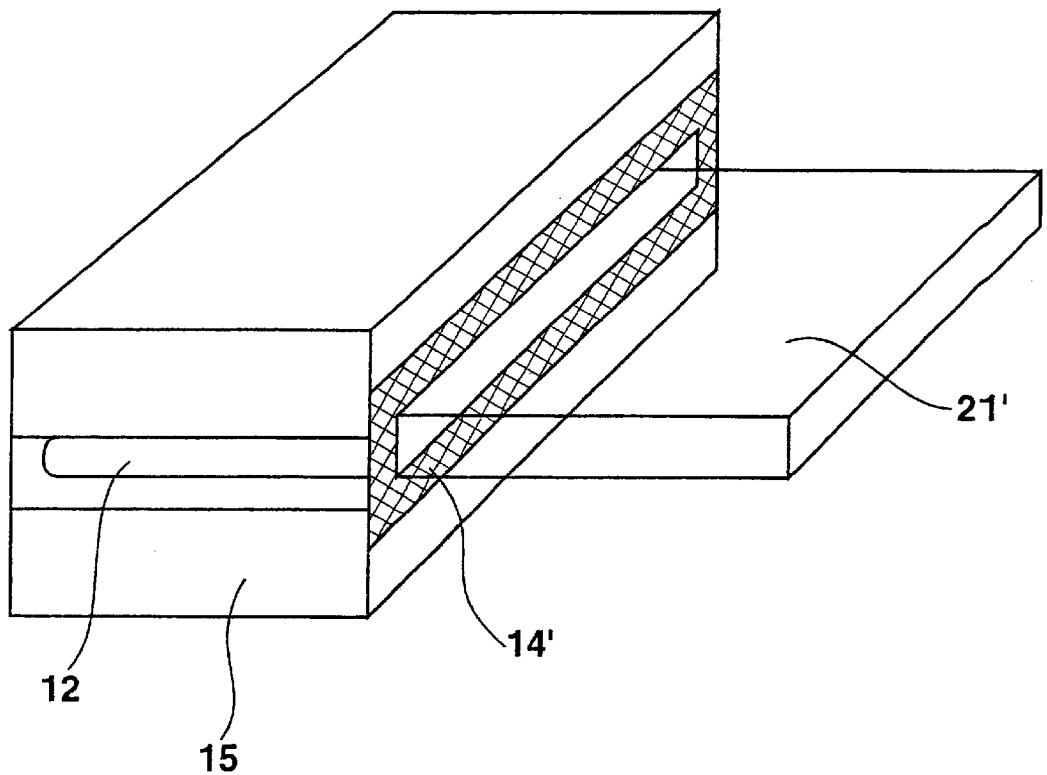
FIG. 2 shows a perspective view of a parallelepiped-shaped hollow body, transparent to electromagnetic radiation, having a slot-shaped beam outlet opening.

FIG. 2 elucidates another embodiment of the present invention, where hollow body 11, transparent to electromagnetic radiation, is not tube-shaped, but parallelepiped-shaped and is provided with a beam outlet opening 13' in the form of a slot having a height of approximately 25 mm. Cold gas plasma 12 is generated, as in the first embodiment, within the parallelepiped by a high-frequency plasma source 15 using slot antenna injection or, alternatively, by injection structures based on the principle of a "wave launcher" that produces cold gas plasma 12, argon being supplied to the parallelepiped on the side opposite beam outlet opening 13' via a gas inlet slot 10'. Hollow body 11 is also here provided with a metal ring 14' as a transition element 14 surrounding beam outlet opening 13' and connecting hollow body 11 to work chamber 19. Thus a flat free cold plasma beam exits hollow body 11 and enters work chamber 19 as plasma beam plane 21'. The other parameters of this embodiment (gas type, gas pressure, gas flow rate, injected power, microwave frequency or high frequency) are scaled as are the parameters of the first embodiment.

In another embodiment of the present invention, two free plasma beams 21 directed opposite each other on a single line, produced as in the first embodiment, are introduced in work zone 31 via two opposite plasma generating zones 30. This results in an axially homogeneous plasma density. Of course, this embodiment can also be configured so that two plasma beam planes 21' directed opposite one another and lying in a single plane are introduced in work chamber 19.

Figure 3:
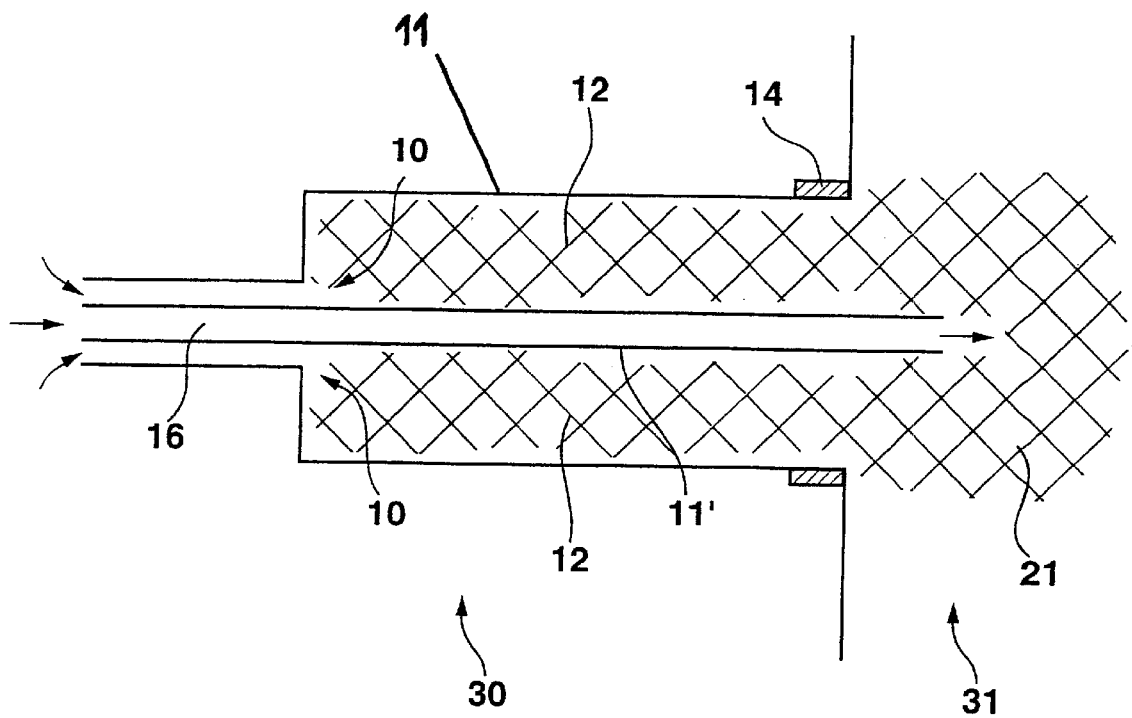
FIG. 3 shows a diagram of a hollow body having an internal gas supply pipe.

FIG. 3 shows another modification of the device according to the present invention where a second hollow body 11', having the shape of a coaxial tube and also made of a material transparent to electromagnetic radiation such as quartz glass, is within hollow body 11, which is also here designed as a quartz glass tube as in the first embodiment. In this embodiment the reactive gas is not introduced into free plasma beam 21 in work chamber 19, but is conducted via gas supply pipe 16 by second hollow body 11' which is coaxial with hollow body 11. In this case, as in the first embodiment, a gas is introduced in hollow body 11 via a gas inlet opening 10, is excited in hollow body 11 in the manner described above to form cold gas plasma 12, and is conducted into the work chamber in the form of free plasma beam 21. The gas introduced is argon, for example. The reactive gas conducted within second hollow body 11', in particular coaxially through hollow body 11, is acetylene, for example. The reactive gas supplied and cold gas plasma 12 only mix in work chamber 19 in free cold plasma beam 21. This arrangement for supplying the reactive gas into free plasma beam 21 has hydraulic advantages and results in better mixing of the reactive gas. In addition, it makes achieving excitation of the reactive gas possible as it passes through second hollow body 11'. Of course, the embodiment according to FIG. 3 can also be modified so that a plurality of additional hollow bodies 11' containing different gases or different gas components contained in the reactive gas are arranged within hollow body 11; these gases or different gas components only mix with the gas plasma and with one another as free cold plasma beam 21 generated enters work chamber 19.

What is claimed is:

1. A device for generating a free cold plasma beam, comprising:

at least one hollow body that is transparent to an electromagnetic radiation and is provided with at least one gas inlet opening and at least one beam outlet opening;

at least one high-frequency plasma source for generating a cold gas plasma within the at least one hollow body;

a work chamber into which the cold gas plasma enters as a free cold plasma beam via the at least one beam outlet opening from the at least one hollow body and is conducted in the work chamber as a bundle; and at least one additional hollow body including at least one gas supply pipe through which one of a reactive gas and a gas component forming the reactive gas is conducted, wherein:

the at least one additional hollow body is arranged within the at least one hollow body such that the reactive gas enters coaxially into the free cold plasma beam in the work chamber.

2. A device for generating a free cold plasma beam, comprising:

at least one hollow body that is transparent to an electromagnetic radiation and is provided with at least one gas inlet opening and at least one beam outlet opening;

at least one high-frequency plasma source for generating a cold gas plasma within the at least one hollow body; and a work chamber into which the cold gas plasma enters as a free cold plasma beam via the at least one beam outlet opening from the at least one hollow body and is conducted in the work chamber as a bundle.

3. The device according to claim 2, wherein:

a pressure in the work chamber is in a range of 0.1 Pa to 1000 Pa.

4. The device according to claim 2, wherein:

the electromagnetic radiation has a power of 10 W to 10 kW, and the at least one high-frequency plasma source injects the electromagnetic radiation into the cold gas plasma via the at least one hollow body.

5. The device according to claim 4, wherein:

the electromagnetic radiation has a power of 500 W to 2 kW.

6. The device according to claim 2, wherein the at least one high-frequency plasma source corresponds to one of:
   a microwave plasma source having slot antenna injection,
   a high-frequency plasma source, and
   a source operating in accordance with a wave launcher principle.

7. The device according to claim 2, wherein:
   the at least one hollow body includes a tube formed from one of a glass, a quartz glass, and a ceramic.

8. The device according to claim 2, wherein:
   the at least one gas inlet opening and the at least one beam outlet opening are opposite one another.

9. The device according to claim 2, wherein:
   the at least one beam outlet opening is shaped as a slot, and
   the free cold plasma beam exits into the work chamber as a flat plasma beam plane.

10. The device according to claim 2, wherein:
    the at least one high-frequency plasma source includes a microwave plasma source that operates in a frequency range of 300 MHz to 30 GHz.

11. The device according to claim 10, wherein:
    the microwave plasma source operates at a frequency of 2.45 GHz.

12. The device according to claim 2, wherein:
    a gas having a flow rate of 10 sccm to 10,000 sccm can be introduced in the at least one hollow body via the at least one gas inlet opening.

13. The device according to claim 12, wherein:
    the gas is one of an inert gas, oxygen, nitrogen, and hydrogen.

14. The device according to claim 13, wherein:
    the inert gas is argon.

15. The device according to claim 2, further comprising:
    at least one gas supply pipe, wherein:
      a reactive gas is capable of being supplied to the free cold plasma beam in the work chamber via the at least one gas supply pipe.

16. The device according to claim 15, wherein:
    the reactive gas corresponds to one of acetylene, methane, silane, HMDS(O), TMS, and TEOS vapor.

17. The device according to claim 15, further comprising:
    at least one workpiece having a reaction zone and being arranged within the work chamber, wherein:
      a plasma coating with the reactive gas occurs in the reaction zone.

* * * * *